United States Patent
Hiblot et al.

(10) Patent No.: US 11,765,910 B2
(45) Date of Patent: Sep. 19, 2023

(54) BIPOLAR SELECTOR DEVICE FOR A MEMORY ARRAY

(71) Applicant: IMEC vzw, Leuven (BE)

(72) Inventors: Gaspard Hiblot, Leuven (BE); Shamin Houshmand Sharifi, Leuven (BE); Luka Kljucar, Leuven (BE)

(73) Assignee: IMEC vzw, Leuven (BE)

( * ) Notice: Subject to any disclaimer, the term of this patent is extended or adjusted under 35 U.S.C. 154(b) by 232 days.

(21) Appl. No.: 17/092,135

(22) Filed: Nov. 6, 2020

(65) Prior Publication Data
US 2021/0143213 A1    May 13, 2021

(30) Foreign Application Priority Data

Nov. 12, 2019    (EP) ..................... 19208590

(51) Int. Cl.
| | |
|---|---|
| *H10B 61/00* | (2023.01) |
| *H01L 29/872* | (2006.01) |
| *G11C 11/16* | (2006.01) |
| *H01L 29/221* | (2006.01) |
| *H01L 29/66* | (2006.01) |
| *H10N 50/01* | (2023.01) |
| *H10N 50/80* | (2023.01) |

(52) U.S. Cl.
CPC ............ *H10B 61/10* (2023.02); *G11C 11/161* (2013.01); *H01L 29/221* (2013.01); *H01L 29/66143* (2013.01); *H01L 29/872* (2013.01); *H10N 50/01* (2023.02); *H10N 50/80* (2023.02)

(58) Field of Classification Search
None
See application file for complete search history.

(56) References Cited

U.S. PATENT DOCUMENTS

| | | |
|---|---|---|
| 7,968,419 B2 | 6/2011 | Li et al. |
| 8,227,788 B2 | 7/2012 | Mikawa et al. |
| (Continued) | | |

FOREIGN PATENT DOCUMENTS

WO    WO 2019/116020    6/2019

OTHER PUBLICATIONS

Chasin, Adrian, et al., Gigahertz Operation of a-IGZO Schottky Diodes, IEEE Transactions on Electron Devices, vol. 60, No. 10, Oct. 2013, pp. 3407-3412.

(Continued)

*Primary Examiner* — Xiaoming Liu
(74) *Attorney, Agent, or Firm* — Knobbe, Martens, Olson & Bear, LLP

(57) ABSTRACT

The disclosed technology relates to a selector device for a memory array, and a method of forming the selector device. In some embodiments, the selector device comprises a first electrode layer embedded in an oxide; a second electrode layer arranged above the first electrode layer and separated from the first electrode layer by the oxide; and a semiconductor material forming a semiconductor layer on the top surface of the second electrode layer, and extending through the second electrode layer and the oxide onto the top surface of the first electrode layer, wherein the semiconductor material contacts the first electrode layer and the second electrode layer. In some embodiments, the selector device helps to solve the sneak path problem in the memory array it is inserted into.

20 Claims, 9 Drawing Sheets

(56) References Cited

U.S. PATENT DOCUMENTS

| | | |
|---|---|---|
| 9,461,094 B2 | 10/2016 | Li et al. |
| 2010/0258779 A1 | 10/2010 | Mikawa et al. |
| 2011/0002155 A1 | 1/2011 | Arita et al. |
| 2012/0193747 A1* | 8/2012 | Rassel ............... H01L 29/66143 |
| | | 257/E29.338 |
| 2012/0267632 A1 | 10/2012 | Ramaswamy et al. |
| 2015/0249096 A1 | 9/2015 | Lupino et al. |
| 2016/0043142 A1 | 2/2016 | Hong et al. |
| 2016/0064461 A1* | 3/2016 | Lee ................... H01L 27/3246 |
| | | 257/40 |
| 2020/0105835 A1* | 4/2020 | Kuo ........................ G11C 8/14 |

OTHER PUBLICATIONS

Chasin, Adrian, et al., High-Performance a-IGZO Thin Film Diode as Selector for Cross-Point Memory Application, IEEE Electron Device Letters, vol. 35, No. 6, Jun. 2014, pp. 642-644.

Zhang, Jiawei, et al., High performance Schottky diodes based on indium-gallium-zinc-oxide, American Vacuum Society. J. Vac. Sci. Technol. A vol. 34, No. 4, Jul/Aug. 2016, p. 04C101-1-04C101-4.

Zhang, Leqi, et al. "High-drive current (> 1MA/em 2) and highly nonlinear (> 10 3) TiN/amorphous-Silicon/TIN scalable bidirectional selector with excellent reliability and its variability impact on the 1S1R array performance." 2014 IEEE Internationa! Electron Devices Meeting. IEEE, 2014.

Extended European Search Report issued May 4, 2020 in corresponding European patent application No. 19208590.0 filed Nov. 12, 2019.

* cited by examiner

BIPOLAR SELECTOR DEVICE FOR A MEMORY ARRAY

CROSS-REFERENCE TO RELATED APPLICATIONS

This application claims foreign priority to European Application EP 19208590.0, filed on Nov. 12, 2019, which is incorporated herein by reference in its entirety.

BACKGROUND

Technological Field

The disclosed technology relates to the field of memory devices, and more particularly, to memory devices including memory arrays. The disclosed technology provides a selector device for a memory array, a method of forming the selector device, and a memory device comprising a memory array and a plurality of the selector devices. The selector device is, in some embodiments, a bipolar selector device comprising a double-sided Schottky diode.

Description of the Related Technology

High-density memory arrays, e.g., magnetic random access memory (MRAM) arrays can suffer from the so-called sneak path problem. This problem arises from cross-talk interference between adjacent memory cells caused by a sneak path current, e.g., between a read-out cell and a neighboring cell. This can result in misinterpretation of the read-out signal of the read-out cell.

Selector devices can be used to protect the read-out signals. In particular, the sneak path problem can be mitigated by inserting selector devices next to the memory cells. The selector devices provide a threshold (diode behavior) for device selection based on word-line and bit-line (source line) voltage.

In spin-torque-transfer (STT)-MRAM array, for instance, the selector devices should be bipolar (a write operation needs current in an opposite direction than a read operation), i.e., there is need for bipolar diodes with a threshold behavior in opposite directions. In particular, bipolar, highly non-linear, selector devices should be inserted next to the memory cells.

One candidate for such selector devices is a double-sided indium-gallium-zinc-oxide (IGZO) Schottky diode, as it is illustrated in FIG. 9 next to a memory element (forming a memory cell) of a memory array. In particular, FIG. 9 shows a selector device 90, which is formed by a top electrode 91 and a bottom electrode 92 connected by an IGZO channel 93. The selector device 90 is connected to a magnetic tunnel junction (MTJ) memory element comprising an MTJ top electrode 94, an MTJ 95, and a MTJ bottom electrode 94.

The selector device requires both contacts of the vertical IGZO channel 93 to be of the Schottky type, i.e., a Schottky interface needs to be formed between the IGZO 93 and the top electrode 91, as well as between the IGZO 93 and the bottom electrode 94. However, it is difficult to obtain a Schottky contact at the top interface of the IGZO channel 93, i.e., the interface to the top electrode 91, because a plasma-assisted process (e.g., physical vapor deposition (PVD)) that is typically involved in the deposition of the top electrode 91, damages the IGZO 93. Thereby, defects are created that make the contact of the IGZO 93 to the top electrode 91 Ohmic instead of Schottky. This leads to the sneak path problem described above.

Attempts have been made to reduce the power of the plasma, which is involved in the deposition of the top electrode 91, but that attempt was still not sufficient to obtain a good Schottky contact between the IGZO 93 and the top electrode 91.

SUMMARY OF CERTAIN INVENTIVE ASPECTS

In view of the above, one objective of the disclosed technology aims to provide an improved solution to the sneak path problem. Another objective is to provide a selector device and an integration flow for fabricating the selector device, which results in a bipolar selector device having good Schottky contacts. The selector device should comprise a double-sided Schottky diode. To this end, defects that make the contacts Ohmic instead of Schottky should not be created. The selector device should in some embodiments be based on a semiconductor material comprising a metal oxide material, like IGZO.

The objectives are achieved by the embodiments of the invention provided in the enclosed independent claims. Advantageous implementations of these embodiments are defined in the dependent claims.

A first aspect of the disclosed technology provides a selector device for a memory array, the selector device comprising: a first electrode layer embedded in an oxide, a second electrode layer arranged above the first electrode layer and separated from the first electrode layer by the oxide, a semiconductor material forming a semiconductor layer on the top surface of the second electrode layer and extending through the second electrode layer and the oxide onto the top surface of the first electrode layer, wherein the semiconductor material contacts the first electrode layer and the second electrode layer.

With the selector device of the first aspect, a double-sided Schottky barrier is obtained, which is necessary to counter the sneak path problem. In some embodiments, a Schottky contact/interface is formed between the semiconductor material and the first electrode layer, as well between the semiconductor material and the second electrode layer. Due to the arrangement of the semiconductor material and how it contacts the first and second electrode layer, respectively, any defects that are created do not impact the Schottky interfaces. This is, because any defects that are created are remote from the Schottky interfaces. Thus, the selector device of the first aspect provides an improved solution to the sneak path problem.

In an embodiment of the selector device, the semiconductor material comprises a metal oxide material, in some embodiments indium gallium zinc oxide or indium tin oxide, or comprises amorphous silicon.

These materials form particularly good Schottky contacts, and therefore improve the selector device further.

In an embodiment of the selector device, the first electrode layer, the semiconductor material, and the second electrode layer form a double-sided Schottky diode.

Thus, the selector devices provides a bipolar threshold (diode behavior), which is well suitable for device selection based on word-line and bit-line (source line) voltage in a memory array.

In an embodiment of the selector device, a first Schottky interface is formed between the semiconductor material extending through the oxide and the top surface of the first electrode layer, and a second Schottky interface is formed between the bottom surface of the semiconductor layer and the top surface of the second electrode layer.

In an embodiment of the selector device, the first electrode layer and/or the second electrode layer comprises platinum, palladium, and/or gold.

These materials have beneficially a work function in a range that provides a preferable Schottky barrier height, and the desired off-current needed for selector activity in, for example, an MRAM array. Palladium may beneficially form an interfacial palladium oxide, e.g., after ozone treatment, which is oxide-rich and thus reduces surface defect concentration of the semiconductor material.

In an embodiment of the selector device, the selector device further comprises a dielectric layer, in some embodiments an aluminum oxide layer, formed on the top and on the sides of the semiconductor layer.

In an embodiment of the selector device, the selector device further comprises a metal layer, in some embodiments a tungsten layer, formed on the top and on the sides of the dielectric layer, wherein the metal layer directly contacts the top surface of the second electrode layer.

The embodiments allow forming the metal layer wrapped around the top of the semiconductor layer, but isolated by the dielectric layer, while the metal layer connects directly to the second electrode layer to ensure electrical connectivity.

A second aspect of the disclosed technology provides a method of forming a selector device for a memory array, the method comprising: forming a first electrode layer, wherein the first electrode layer is embedded in an oxide, forming a second electrode layer above the first electrode layer, wherein the second electrode layer is separated from the first electrode layer by the oxide, forming an opening in the second electrode layer and in the oxide, wherein forming the opening exposes a part of the top surface of the first electrode layer, and depositing a semiconductor material, such that it fills the opening and forms a semiconductor layer on the top surface of the second electrode layer, wherein the semiconductor material contacts the first electrode layer and the second electrode layer.

The method of the second aspect results in the selector device of the first aspect, and thus all advantages described above. Without being bound by theory, the way in which the semiconductor material is formed, leads to Schottky interfaces between this semiconductor material and the first and second electrode layer, respectively.

For forming the opening, for example, a trench may be formed, e.g., etched, through the second electrode layer and the oxide onto the top surface of the first electrode layer, such that the trench exposes a part of the top surface of the first electrode layer. Alternatively, an aperture may first be formed in the second electrode layer, and the second electrode layer can then be used as a hard mask for an oxide etch through the aperture, which lands on the first electrode layer. Alternatively, the second electrode layer could be patterned into a perforated shape, e.g., with a Damascene process, and can then be used as a hard mask for an oxide etch, which lands on the first electrode layer.

In an embodiment of the method, the bottom surface of the first electrode layer is electrically connected to a memory element of the memory array.

Thus, the selector device can function in the memory array to mitigate the sneak path problem.

In an embodiment of the method, the method further comprises patterning the semiconductor layer into a semiconductor patch arranged on the top surface of the second electrode layer.

In an embodiment of the method, the method further comprises forming a dielectric layer around the semiconductor patch, and forming a metal layer, in some embodiments forming a tungsten layer, around the dielectric layer, wherein the metal layer contacts the top surface of the second electrode layer.

This allow forming the metal layer wrapped around the top of the semiconductor patch (remainder of the patterned semiconductor layer), but isolated by the dielectric layer, while the metal layer connects directly to the second electrode layer to ensure electrical connectivity. The metal layer may provide connection to a BEOL structure.

In an embodiment of the method, the method further comprises encapsulating the semiconductor patch with the dielectric layer, anisotropically etching the dielectric layer, such that a part of the top surface of the second electrode layer is exposed without exposing the encapsulated semiconductor patch, further encapsulating the encapsulated semiconductor patch with the metal layer, such that the metal layer contacts the exposed part of the top surface of the second electrode layer.

In an embodiment of the method, the dielectric layer is an aluminum oxide layer.

In an embodiment of the method, the method further comprises forming a BEOL structure above the metal layer, wherein the BEOL structure is electrically connected to the metal layer.

A third aspect of the disclosed technology provides a selector device for a memory array, wherein the selector device is fabricated using a method according to the second aspect or any embodiment thereof.

The selector device fabricated using the method of the second aspects can be distinguishing from conventional selector devices, in some embodiments, in the resulting semiconductor material connecting the first electrode layer and the second electrode layer.

A further aspect of the disclosed technology provides a memory device, comprising: a memory array including a plurality of memory elements, and a plurality of selector devices, wherein each selector device is according to the first aspect or any embodiment thereof or according to the third aspect, wherein each selector device is electrically connected to one of the memory elements.

The memory device of the fourth aspect enjoys the advantages of the selector device of the first aspect or third aspect described above. In some embodiments, in the memory array of the memory device, the sneak path problem is solved.

BRIEF DESCRIPTION OF THE DRAWINGS

The above described aspects and embodiments are explained in the following description of embodiments with respect to the enclosed drawings.

DETAILED DESCRIPTION OF CERTAIN ILLUSTRATIVE EMBODIMENTS

Figure 1:
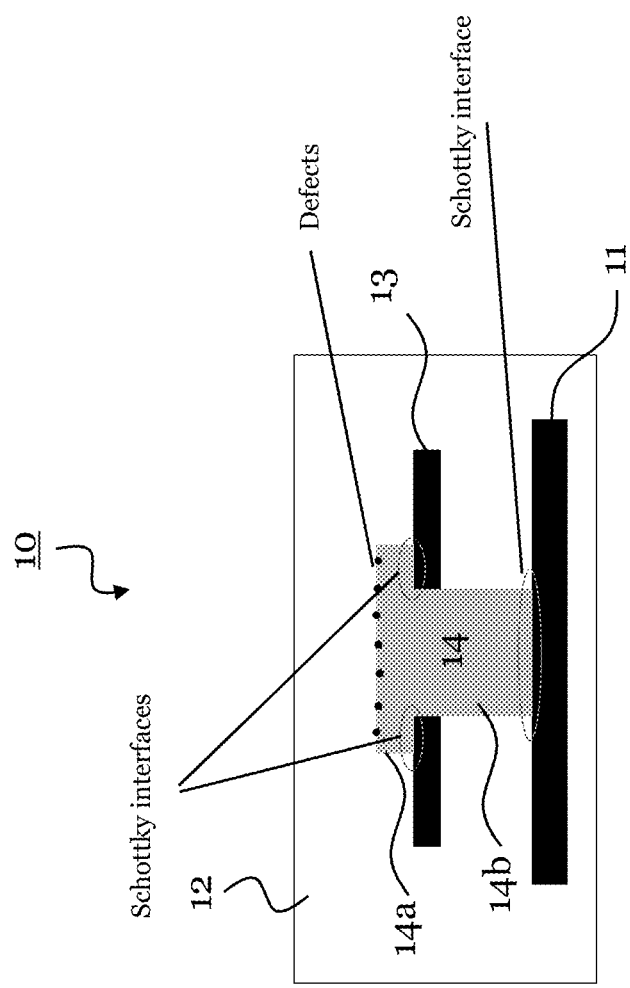
FIG. 1 shows a selector device according to an embodiment of the disclosed technology.

FIG. 1 shows a selector device 10 according to an embodiment of the disclosed technology in a cross-sectional view. The selector device 10 is suitable for a memory array, i.e., it can be inserted into the memory array, in some embodiments, can be electrically connected to one of the memory elements (forming the memory cells) of the memory array. In the memory array, a plurality of the selector devices 10 can solve the sneak path problem.

The selector device 10 comprises a first (bottom) electrode layer 11, which is embedded in an oxide 12, e.g., a silicon dioxide. The first electrode layer 11 may be made of, or may comprise, platinum, palladium, and/or gold.

Further, the selector device 10 comprises a second (top) electrode layer 13, which is arranged above the first electrode layer 11, and is separated from the first electrode 11 layer by the oxide 12, in some embodiments, by a part of the oxide 12. The second electrode layer 13 may be made of, or may comprise, platinum, palladium, and/or gold.

As used herein, the term "above" refers to a stacking direction of the layers of the selector device 10, which is in FIG. 1 from the bottom to the top of the figure. The stacking direction may correspond to a fabrication direction of the layers. The terms "beneath", or "top" or "bottom", or similar terms, are likewise related to this stacking direction. The second electrode layer 11 is specifically distanced from the first electrode layer by a certain thickness/part of the oxide 12.

The selector device further comprises a semiconductor material 14, which may be, or may comprise, a metal oxide material. For example, it may be, or may comprise, IGZO, or ITO, or it may be, or may comprise, amorphous silicon or a similar material. The semiconductor material 14 forms a semiconductor layer 14a on the top surface of the second electrode layer 13. Further, the semiconductor material 14 extends through, e.g., forms a semiconductor channel 14b through, the second electrode layer 13 and the oxide 12, respectively, which lands on the top surface of the first electrode layer 11. The semiconductor layer 14a and the semiconductor channel 14b may be formed integrally. The semiconductor material 14 contacts the second electrode layer 13, in some embodiments, the semiconductor layer 14a contacts a top surface of the second electrode layer 11. Further, the semiconductor material 14 contacts the first electrode layer 11, in some embodiments, the semiconductor channel 14b contacts the top surface of the first electrode layer 11.

Thereby, multiple Schottky interfaces are formed as indicated in FIG. 1. A first Schottky interface is formed between the semiconductor material 14, which extends through the oxide 12, and the top surface of the first electrode layer 11. One or more second Schottky interfaces are formed between the bottom surface of the semiconductor layer 14a and the top surface of the second electrode layer 13. Thus, the first electrode layer 11, the semiconductor material 14, and the second electrode layer 13 form a double-sided Schottky diode.

The formation of these Schottky interface between the semiconductor material 14 and, respectively, the first electrode layer 11 and the second electrode layer 13, is an important aspect. The materials of the first and second electrode layer 11 and 13 should thus, respectively, be selected such that the work function of the material is in a range that results in a Schottky barrier having a desired height and a desired off-current needed for selector activity in a memory array. Thus, platinum, palladium, and/or gold may be used for the first and/or the second electrode layers 11 and 13, in some embodiments, in combination with IGZO as the semiconductor material 14. Furthermore, palladium can form an interfacial palladium oxide, e.g., after ozone treatment, which is oxide-rich, and may hence advantageously reduce the surface defect concentration of the IGZO.

It is further illustrated in FIG. 1 that any defects that are formed in the semiconductor material 14, are not formed close to or at the first Schottky interface between the semiconductor layer 14a and the second electrode layer 13. Thus, this interface is not endangered to become Ohmic during fabrication of the selector device 10.

Figure 2:
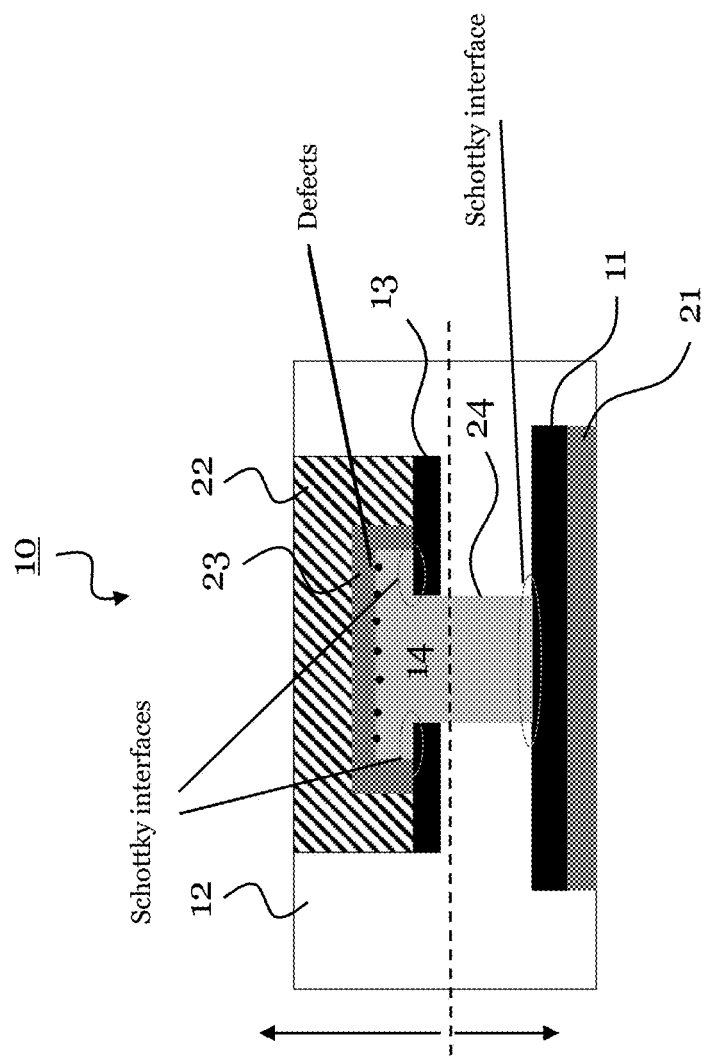
FIG. 2 shows a selector device, exemplarily provided in a memory array, according to an embodiment of the disclosed technology.

FIG. 2 shows the selector device 10 according to an embodiment of the disclosed technology, which builds on the embodiment shown in FIG. 1. In some embodiments, the selector device 10 of FIG. 2 comprises further, optional features, and is exemplarily illustrated as provided in a memory array. Same features in FIG. 1 and FIG. 2 are labelled with the same reference signs, and function likewise.

The selector device 10 shown in FIG. 2 further comprises a dielectric layer 23, which is formed on the top and on the sides of the semiconductor layer 14a. The dielectric layer 23 may thus be wrapped around the semiconductor layer 14a. The dielectric layer 23 may be, or may comprise, an aluminum oxide layer or silicon dioxide. These oxides do not tend to absorb oxygen from the semiconductor material, e.g., IGZO, in contrast to other dielectrics like silicon nitride. Absorption of oxygen would cause oxygen vacancies in the semiconductor material, which would induce traps. Further, the selector device 10 comprises a metal layer 22, which is formed on the top and on the sides of the dielectric layer 23. The metal layer 22 may thus be wrapped around the dielectric layer 23. The metal layer 22 is formed such that it contacts the top surface of the second electrode layer 13. The metal layer 22 may be, or may comprise, tungsten.

Further, the selector device 10 of FIG. 2 is connected to a memory element of the memory array, into which it is inserted, in some embodiments it is connected to a top electrode 21 of the memory element. The memory element may be a MTJ memory element and may form a bit-cell of the memory array. The top electrode 21 is notably not a part of the selector device 10. The selector device 10 and the memory element may form a memory device. A memory device according to an embodiment of the disclosed technology may further be formed by the memory array, which includes a plurality of memory elements, and a plurality of selector devices 10, wherein each selector device 10 is connected to one of the memory elements as shown in FIG. 2. This memory device does not suffer significantly from the sneak path problem.

For fabricating the selector device 10, which is shown in FIG. 2, the top (second) electrode layer 13 may be deposited before the semiconductor material 14 (e.g., the IGZO). The semiconductor material channel 14b of the selector device 10 may then be formed by first etching through the second electrode layer 13 and the oxide 12, which separates the second electrode layer 13 from the bottom (first) electrode layer 11. Second, by depositing the semiconductor material 14 to fill the etched opening or trench, thereby creating a contact of the semiconductor material 14 to both the second electrode layer 13 and the first electrode layer 11.

The dielectric layer 23 may then be deposited on top of the semiconductor material 14, hence, potentially creating defects at the interface of semiconductor material 14 and dielectric layer 23. However, such defects have no impact on the electrical performance of the selector device 10, because they are not located in the path of the current, or near the Schottky interface between the second electrode layer 13 and the semiconductor material 14.

A connection to the upper levels of the BEOL may be obtained. For instance, by further using an etch stop layer (e.g., $Al_2O_3$) and an anisotropic opening etch, which may expose the first electrode layer 13 without reaching the top of the semiconductor layer 14a. This can prevent that a contact between the BEOL and the semiconductor material 14 becomes Ohmic.

In the selector device 10 shown in FIG. 2, particularly due to the integration flow used for its fabrication that is presented in detail below, both the sidewalls 24 of the semiconductor channel 14b, and the interfaces of the semiconductor material 14 to the first and second electrode layers 11 and 13 are defect free. Any defects are concentrated at the top of the semiconductor material 14, i.e., close its interface to the oxide 12 or dielectric layer 23, wherein those defects have no impact on the selector device 10 performance. In some embodiments, the performance is not impacted by those defects, since there is only a potential difference between the second and first electrode layer 11 and 13, but there is no potential difference between the second electrode layer 13 and the top of the device 10, during operation of the selector device 10. The sidewalls 14 of the semiconductor channel 14b are not exposed to etching, and thus no defects are created.

Figure 3:
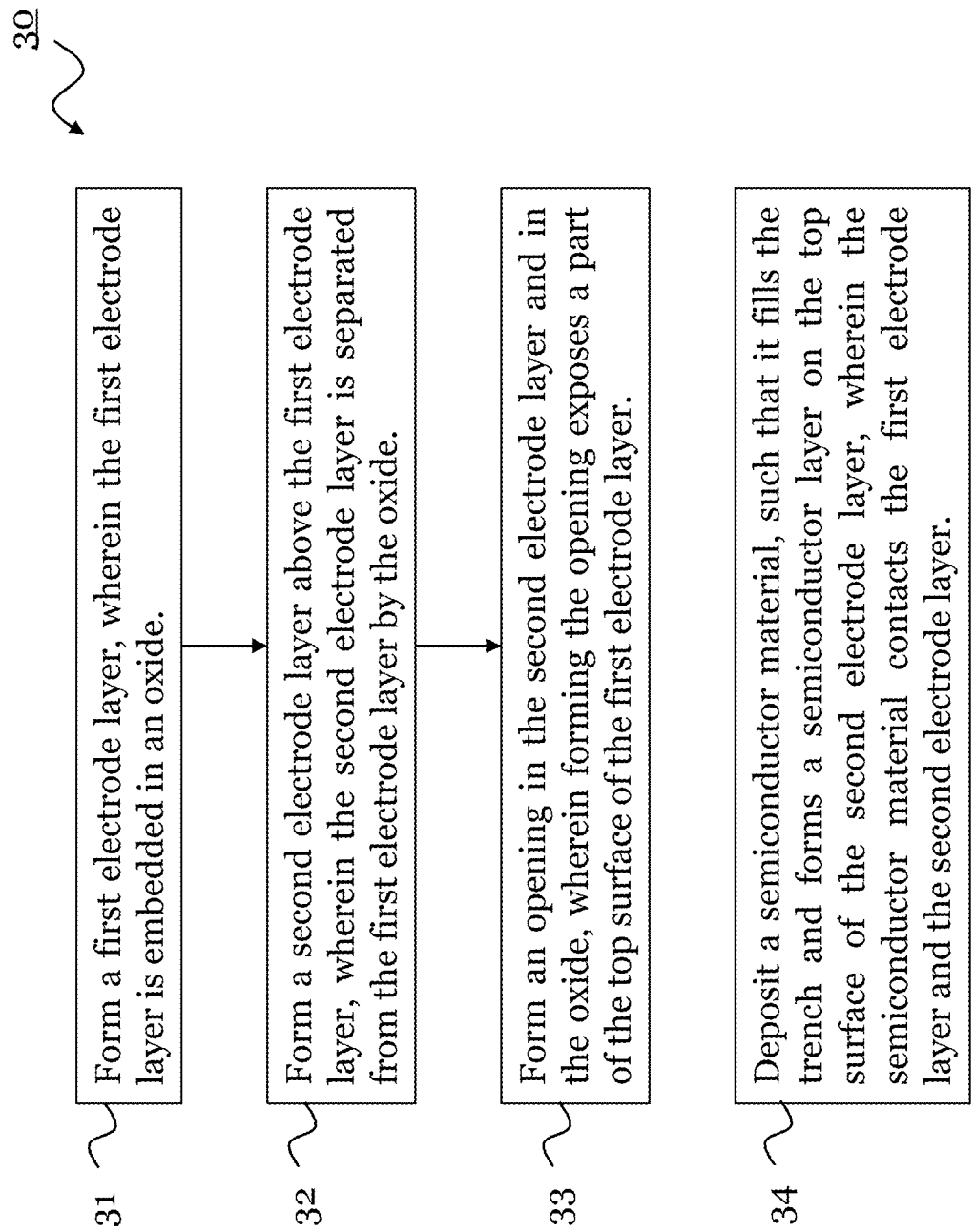
FIG. 3 shows a method according to an embodiment of the disclosed technology.

FIG. 3 shows a general method 30 for fabricating the selector device 10 shown in FIG. 1 or FIG. 2. The method 30 comprises: a step 31 of forming a first electrode layer 11, wherein the first electrode layer 11 is embedded in an oxide 12; a step 32 of forming a second electrode layer 13 above the first electrode layer 11, wherein the second electrode layer 13 is separated from the first electrode layer 11 by the oxide 12; a step 33 of forming an opening 43 in the second electrode layer 13 and in the oxide 12, wherein forming the opening 43 exposes a part of the top surface of the first electrode layer 11; and a step 34 of depositing 34 a semiconductor material 14, such that it fills the opening 43 and forms a semiconductor layer 14a on the top surface of the second electrode layer 13, wherein the semiconductor material 14 contacts the first electrode layer 11 and the second electrode layer 13.

A detailed integration flow for fabricating the selector device 10 as shown in FIG. 1 or FIG. 2 is illustrated in FIG. 4-FIG. 8. This integration flow includes the steps of the general method 30, and is shown for integration of the selector device 10 into a memory array.

Figure 4:
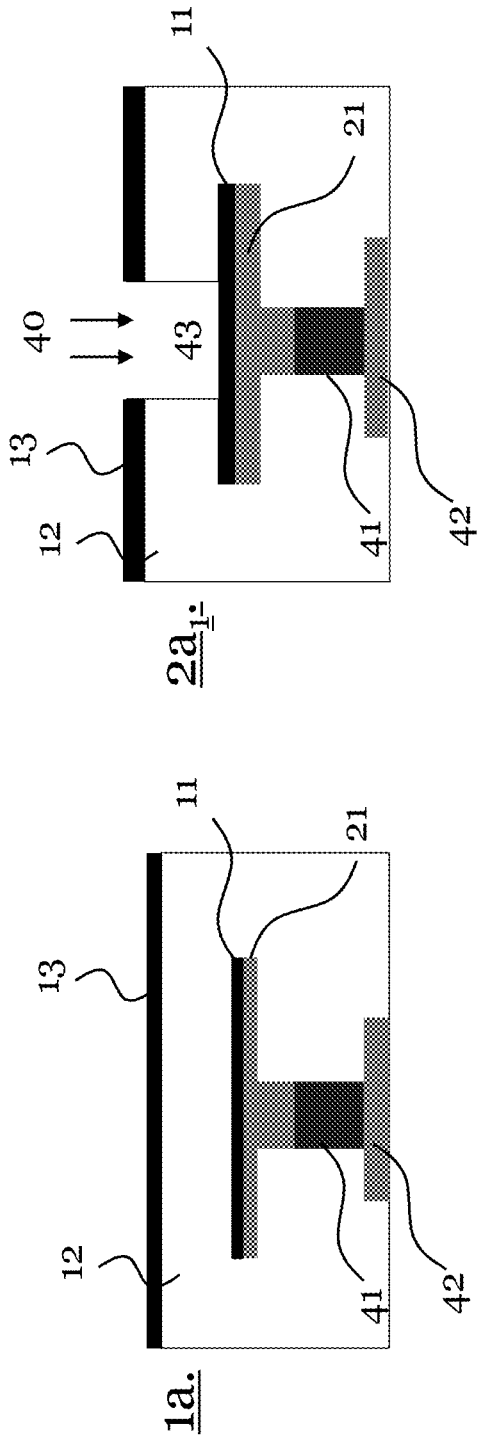
FIG. 4 shows steps 1*a*-3*a* of an integration flow to fabricate a selector device according to an embodiment of the disclosed technology.
Figure 4:
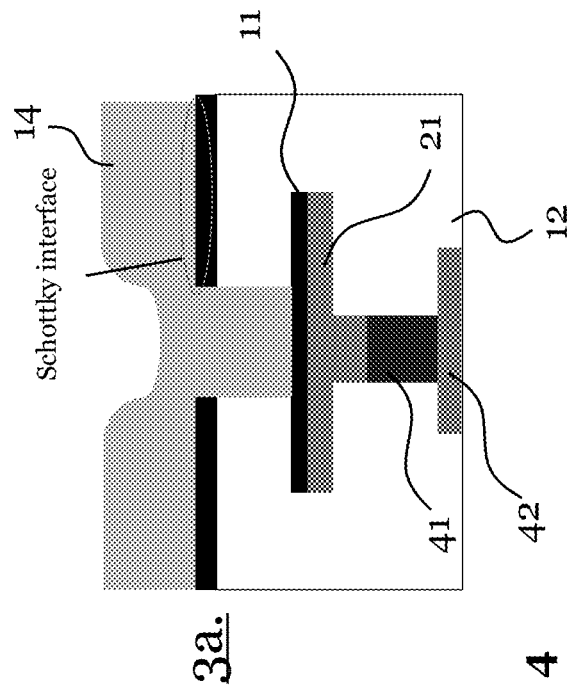

FIG. 4 shows steps 1a-3a of the integration flow. It is here exemplarily assumed that a magnetic memory element of the memory array is already formed by a top electrode 21, a MTJ 41, and a bottom electrode 42. Further, it is assumed that the first electrode layer 11 is already deposited onto the top electrode 21 of the memory element, and that the first electrode layer 11 is embedded into an oxide 12. This relates to step 31 of the general method 30.

In step 1a, the second electrode layer 13 is deposited. For forming the second electrode layer 13, like the first electrode layer 11, a platinum blanket deposition may be performed. This step 1a relates to step 32 of the general method 30.

In step 2a1, a lithographic etch 40 (indicated with the arrows) may be performed to create an opening 43, e.g., a trench, in the second electrode layer 13 and in the oxide 12, such that the opening 43 lands on the first electrode layer 11 and exposes a part of the top surface of the first electrode layer 11. This step 2a1 relates to step 33 of the general method 30.

In step 2a2, an alternative to step 2a1 is shown. Here, the second electrode layer 13 is patterned first, e.g., an aperture 44 is formed in the second electrode layer 13. This may be done by etching. The patterned second electrode layer 13 can then be used as a hard mask for an oxide etch 45 into the oxide 12 (as indicated with the arrows). The etch 45 in the end lands on the first electrode layer 11 and forms the opening 43 (as indicated with the dotted lines).

In step 3a, the semiconductor material 14, for instance IGZO, is deposited and fills the opening 43 created in step 2a1 or 2a2. Thereby, no damage is created to the Schottky interface, which is formed between the semiconductor material 14 and the second electrode layer 13. This step 3a relates to step 34 of the general method 30.

Figure 5:
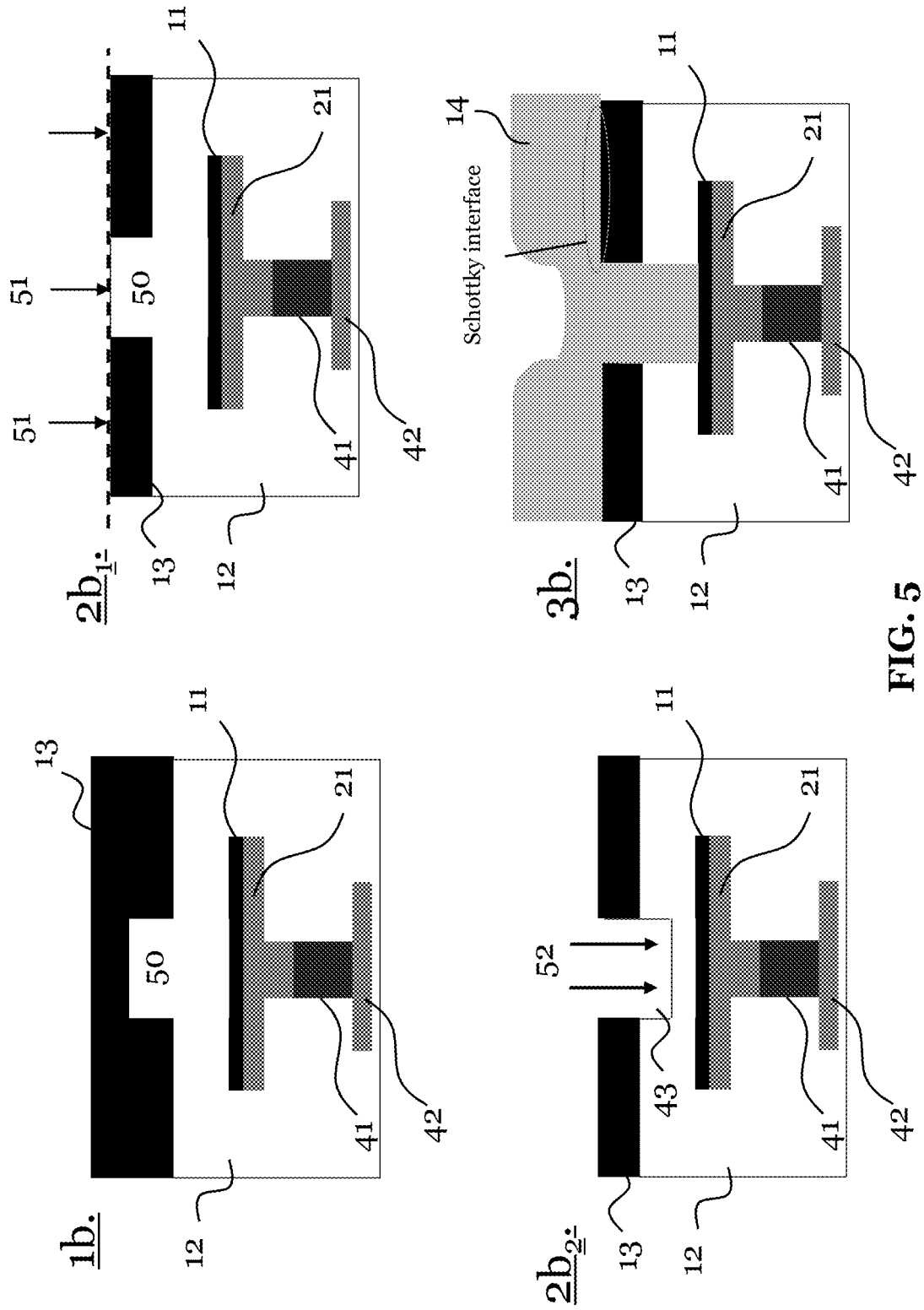
FIG. 5 shows steps 1*b*-3*b* of an integration flow to fabricate a selector device according to an embodiment of the disclosed technology.

FIG. 5 shows steps 1b-3b of the integration flow, which are alternative to the steps 1a-3a shown in FIG. 4. Further, FIG. 5 shows how the opening 43 can be obtained using a Damascene process. It is here again exemplarily assumed that a magnetic memory element of the memory array is already formed by a top electrode 21, a MTJ 41, and a bottom electrode 42. Further, it is assumed that the first electrode layer 11 is already deposited onto the top electrode 21 of the memory element, and that the first electrode layer 11 is embedded into an oxide 12. This relates to step 31 of the general method 30. Further, it is assumed that the oxide 12 has already been patterned, e.g., by a patterning etch, to form a protruding structure 50.

In step 1b, the second electrode layer 13 is deposited. For forming the second electrode layer 13, like the first electrode layer 11, a platinum blanket deposition may be performed. The second electrode layer 13 is specifically deposited over the protruding structure 50 and on the recessed surface of the oxide 12, i.e., the second electrode layer 13 encapsulates the protruding structure 50. This step 1a relates to step 32 of the general method 30.

In step 2b1, CMP 51 is performed, in order to reduce the thickness of the second electrode layer 13. In some embodiments, the thickness is reduced such that the second electrode layer 13 is removed from the top surface of the protruding structure 50, and only remains next to the protruding structure 50 on the recessed top surface of the oxide 12.

In step 2b2, a self-aligned oxide etch 52 is performed into the oxide 12 (aligned with the protruding structure 50). That is, the patterned second electrode layer 13 is used as a hard mask for the oxide etch 52 (as indicated with the arrows). The etch 52 in the end lands on the first electrode layer 11 and forms the opening 43 (as indicated with the dotted lines). This step 2b2 relates to step 33 of the general method 30.

In step 3b, the semiconductor material 14, for instance IGZO, is deposited and fills the opening 43 created in step 2b1 and 2b2. Thereby, no damage is created to the Schottky interface, which is formed between the semiconductor material 14 and the second electrode layer 13. This step 3b relates to step 34 of the general method 30.

Figure 6:
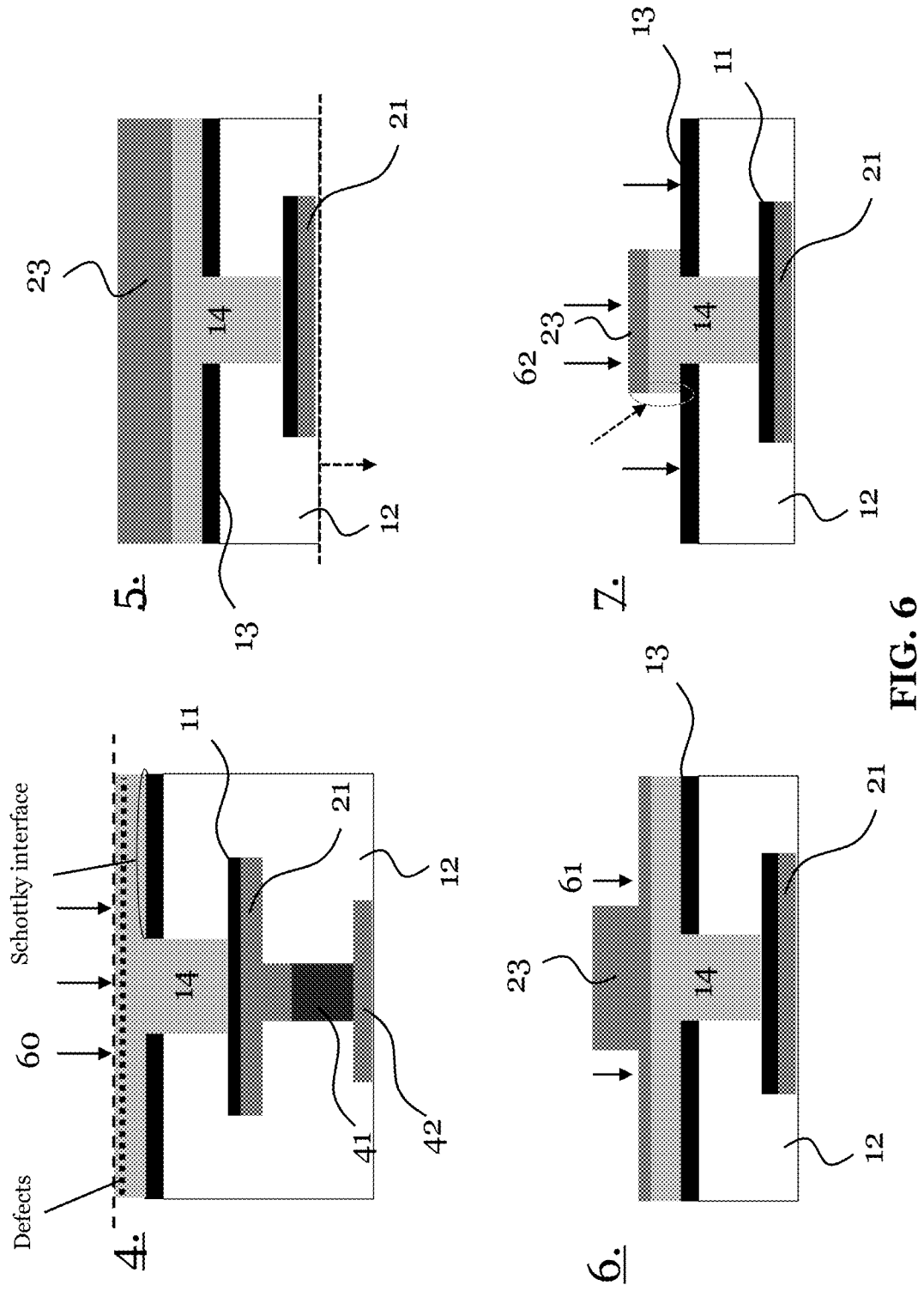
FIG. 6 shows steps 4-7 of an integration flow to fabricate a selector device according to an embodiment of the disclosed technology.

FIG. 6 shows further steps 4-7 of the integration flow, wherein step 4 continues either step 3a of FIG. 4 or step 3b of FIG. 5. Notably, from now on, the MTJ 41 and second electrode 42 and below are not illustrated anymore for sake of simplicity.

In step 4, the semiconductor material 14 is planarized 60. For instance, chemical mechanical planarization/polishing (CMP) or CMP+etch after planarization may be performed, in order to reduce the defect density. Defects in the semiconductor material 14 may form at its top as indicated, but these defects have no impact on later performance of the selector device 10. No damage/defects are created at the interface between the semiconductor material 14 and the second electrode layer 13, so that a good Schottky contact is formed. This step 4 still relates to step 34 of the general method 30.

In step 5, a dielectric layer 23 is provided onto the semiconductor material 14. In some embodiments, an aluminum oxide layer may be deposited, e.g., by means of plasma-enhanced chemical vapor deposition (PECVD).

In step 6, the dielectric layer 23 is patterned. For example, reactive ion etching (RIE) 61 may be used to pattern the (aluminum) dielectric layer 23, and the patterning is stopped before the etching 61 reaches the semiconductor material 14.

In step 7, ion beam etching (IBE) 62, using the dielectric layer 23 as a hard mask, is performed, in order to further pattern the dielectric layer 23, and to further pattern the semiconductor material 14. In some embodiments, the semiconductor layer 14a formed on the second electrode layer 13 is patterned into a semiconductor patch. Notably, re-sputtering of the material of the second electrode layer 13, e.g., re-sputtering of platinum, is not an issue at the semiconductor material sidewall (indicated by the dashed arrow and circle).

Figure 7:
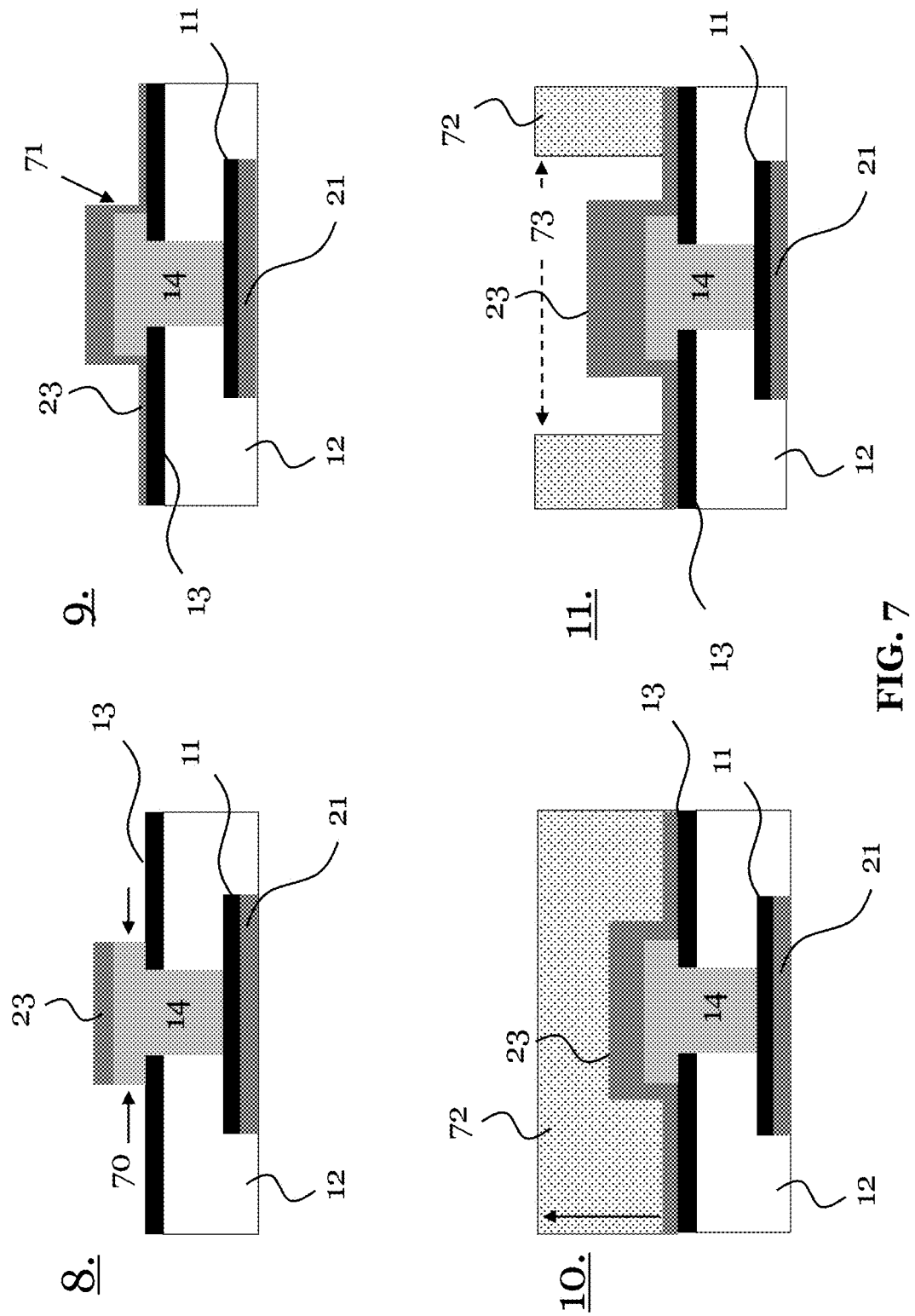
FIG. 7 shows steps 8-11 of an integration flow to fabricate a selector device according to an embodiment of the disclosed technology.

FIG. 7 shows further steps 8-11 of the integration flow.

In step 8, an oxygen anneal is performed, leading to oxygen penetration 70 into the semiconductor material 14, in some embodiments from the sides. This improves the quality of the semiconductor channel 14b, in some embodiments for IGZO as the semiconductor material 14, by reducing the density of oxygen vacancy traps.

In step 9, conformal PECVD 71 is performed to further deposition dielectric material, e.g., aluminum oxide. This is, in some embodiments, performed such that the resulting dielectric layer 23 encapsulates the semiconductor patch formed in step 7. Thus, the path for oxygen and moisture is blocked. In some embodiments, the encapsulation ensures that the oxygen inserted by the anneal (see above) does not escape.

In step 10, a sacrificial material 72 is provided over the dielectric layer 23, specifically filled as indicated by the arrow, and is then planarized. The sacrificial material 72 may be a material that is selectively removable with respect to the material of the metal layer 22, e.g., W/Cu, and/or with respect to the material of the dielectric layer 23. For instance, the sacrificial material 72 may be an oxide, like a silicon oxide.

In step 11, an opening 73 in the sacrificial material 72 is created by performing a lithographic etch, wherein the etch stops on the dielectric layer 23. The etch stop may be achieved by the sacrificial material 72 being selectively removable with respect to the dielectric layer 23.

Figure 8:
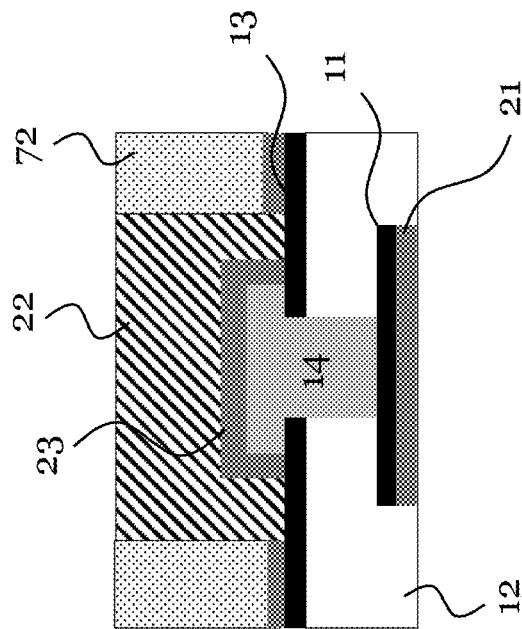
FIG. 8 shows steps 12-15 of an integration flow to fabricate a selector device according to an embodiment of the disclosed technology.
Figure 8:
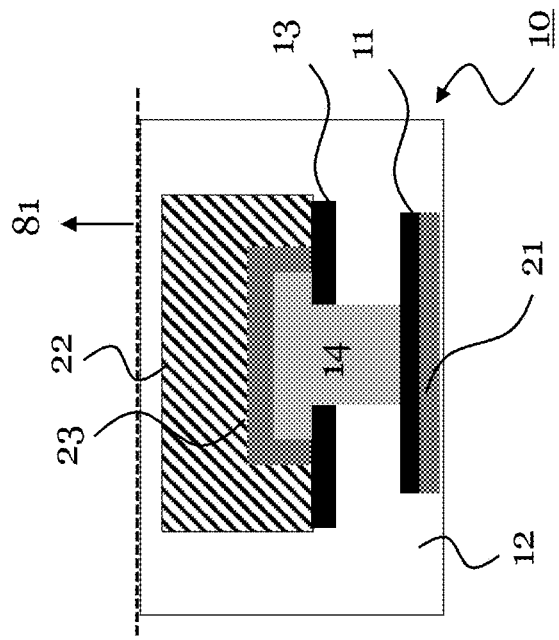
Figure 8:
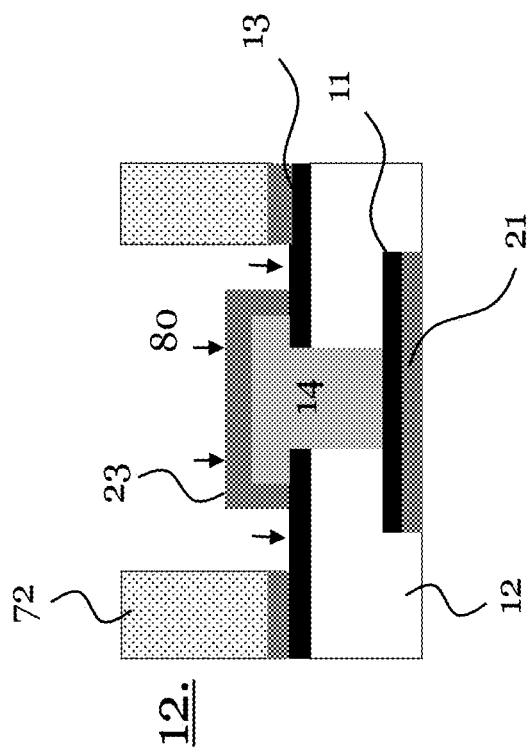
Figure 8:
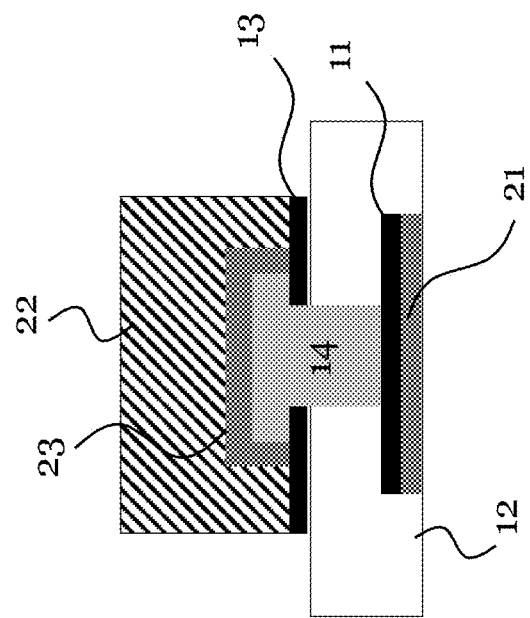
Figure 9:
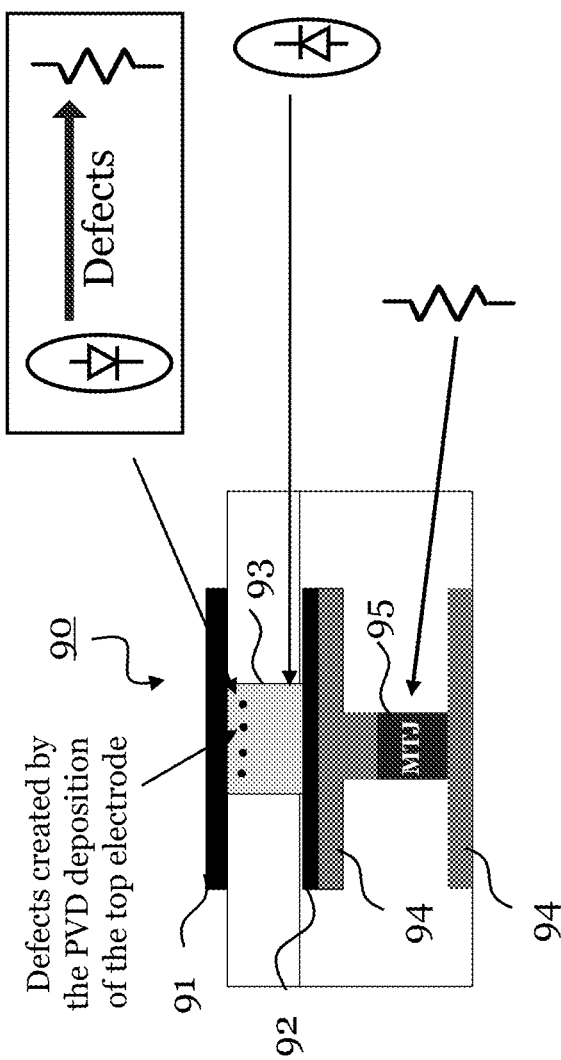
FIG. 9 shows a conventional selector device in a memory array.

FIG. 8 shows steps 12-15 of the integration flow.

In step 12, the dielectric layer 23 is anisotropically etched 80 through the opening 73 formed in step 11, in order to expose parts of the top surface of the second electrode layer 13.

In step 13, a metal layer 22 is filled into the openings etched in step 11 and 12. In some embodiments, a tungsten fill Damascene process can be applied, in order to fill tungsten into the openings. Further, a titanium nitride barrier may be formed in this step.

In step 14, a self-aligned etch is performed, i.e., self-aligned on the metal layer 22, in order to etch the sacrificial material 72, parts of the dielectric layer 23, and parts of the second electrode layer 13. The self-aligned etch does not need to be selective to the materials of the dielectric layer 23 and of the second electrode layer 13, because these are typically very thin layers. Thus, it is acceptable if the etch of the dielectric layer 23 and the second electrode layer 13 also etches the metal layer 22 (which is typically much thicker than the dielectric layer 23 and the second electrode layer 13, respectively). Selectivity between the sacrificial material 72 and the metal layer 22 may be utilized in some embodiments.

In step 15, a continuation to the BEOL is processed 81. In some embodiments, PECVD can be used, in order to dispose an oxide, in which BEOL can be further processed.

In summary, the integration flow, which is a specific embodiment of the general method 30, leads to a selector device 10 according to an embodiment of the disclosed technology being fabricated. This selector device 10 comprises the double-sided Schottky diode formed by first electrode layer 11, semiconductor material 14 and second electrode layer 13, and can thus help to solve the sneak path problem.

What is claimed is:

1. A selector device for a memory array, the selector device comprising:
   a first electrode layer embedded in an oxide;
   a second electrode layer arranged above the first electrode layer and being separated from the first electrode layer by the oxide; and
   a semiconductor material forming a semiconductor layer on the top surface of the second electrode layer, and extending through the second electrode layer and the oxide onto the top surface of the first electrode layer,
   wherein the semiconductor material contacts the first electrode layer and the second electrode layer, and wherein the first electrode layer, the semiconductor material, and the second electrode layer form a double-sided Schottky diode.

2. The selector device according to claim 1, wherein:
   the semiconductor material is a metal oxide material, or amorphous silicon.

3. The selector device according to claim 1, wherein:
   a first Schottky interface is formed between the semiconductor material extending through the oxide and the top surface of the first electrode layer, and
   a second Schottky interface is formed between the bottom surface of the semiconductor layer and the top surface of the second electrode layer.

4. The selector device according to claim 1, wherein:
   the first electrode layer is formed of platinum, palladium, and/or gold, and
   the second electrode layer is formed of platinum, palladium, and/or gold.

5. The selector device according to claim 1, further comprising:
   a dielectric layer formed on the top and on the sides of the semiconductor layer.

6. The selector device according to claim 5, further comprising:
   a metal layer formed on the top and on the sides of the dielectric layer,
   wherein the metal layer directly contacts the top surface of the second electrode layer.

7. A memory device, comprising:
   a memory array having a plurality of memory elements; and
   a plurality of selector devices according to claim 1,
   wherein each selector device is electrically connected to one of the memory elements.

8. The selector device according to claim 2, wherein the metal oxide material is indium gallium zinc oxide or indium tin oxide.

9. The selector device according to claim 5, wherein the dielectric layer is an aluminum oxide layer.

10. The selector device according to claim 6, wherein the metal layer is a tungsten layer.

11. A selector device for a memory array, the selector device comprising:
   a first electrode layer embedded in an oxide;
   a second electrode layer arranged above the first electrode layer and being separated from the first electrode layer by the oxide; and
   a semiconductor material forming a semiconductor layer on the top surface of the second electrode layer, and extending through the second electrode layer and the oxide onto the top surface of the first electrode layer,
   wherein the semiconductor material contacts the first electrode layer and the second electrode layer,
   wherein a first Schottky interface is formed between the semiconductor material extending through the oxide and the top surface of the first electrode layer, and
   wherein a second Schottky interface is formed between the bottom surface of the semiconductor layer and the top surface of the second electrode layer.

12. The selector device according to claim 11, wherein the first electrode layer is formed of platinum, palladium, and/or gold, and the second electrode layer is formed of platinum, palladium, and/or gold.

13. The selector device according to claim 11, further comprising a dielectric layer formed on the top and on the sides of the semiconductor layer.

14. The selector device according to claim 13, further comprising a metal layer formed on the top and on the sides of the dielectric layer, wherein the metal layer directly contacts the top surface of the second electrode layer.

15. A memory device, comprising:
   a memory array having a plurality of memory elements; and
   a plurality of selector devices according to claim 11,
   wherein each selector device is electrically connected to one of the memory elements.

16. A selector device for a memory array, the selector device comprising:
   a first electrode layer embedded in an oxide;
   a second electrode layer arranged above the first electrode layer and being separated from the first electrode layer by the oxide; and
   a semiconductor material forming a semiconductor layer on the top surface of the second electrode layer, and extending through the second electrode layer and the oxide onto the top surface of the first electrode layer,
   wherein the semiconductor material contacts the first electrode layer and the second electrode layer,
   wherein the first electrode layer is formed of platinum, palladium, and/or gold, and
   wherein the second electrode layer is formed of platinum, palladium, and/or gold.

17. The selector device according to claim 16, further comprising a dielectric layer formed on the top and on the sides of the semiconductor layer.

18. The selector device according to claim 17, further comprising a metal layer formed on the top and on the sides of the dielectric layer, wherein the metal layer directly contacts the top surface of the second electrode layer.

19. The selector device according to claim 18, wherein the dielectric layer is an aluminum oxide layer, and wherein the metal layer is a tungsten layer.

20. A memory device, comprising:
   a memory array having a plurality of memory elements; and
   a plurality of selector devices according to claim 16,
   wherein each selector device is electrically connected to one of the memory elements.

* * * * *